United States Patent
Geraghty et al.

(10) Patent No.: US 6,985,100 B2
(45) Date of Patent: Jan. 10, 2006

(54) INTEGRATED CIRCUIT COMPRISING A DAC WITH PROVISION FOR SETTING THE DAC TO A CLEAR CONDITION, AND A METHOD FOR SETTING A DAC TO A CLEAR CONDITION

(75) Inventors: Donal P. Geraghty, Monaleen (IE); Denis Martin O'Connor, Banteer (IE); Dennis Arnold Dempsey, Crecora (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/731,856

(22) Filed: Dec. 9, 2003

(65) Prior Publication Data

US 2004/0119625 A1 Jun. 24, 2004

Related U.S. Application Data

(60) Provisional application No. 60/431,908, filed on Dec. 9, 2002.

(51) Int. Cl.
    *H03M 1/00* (2006.01)

(52) U.S. Cl. ........................... 341/141; 341/144
(58) Field of Classification Search ............... 341/141, 341/144
    See application file for complete search history.

(56) References Cited

U.S. PATENT DOCUMENTS

| 3,745,557 | A | * | 7/1973 | Gilbert ........................ 341/144 |
| 4,202,042 | A | * | 5/1980 | Connors et al. ............. 341/144 |
| 5,270,715 | A | * | 12/1993 | Kano .......................... 341/139 |
| 5,319,371 | A | * | 6/1994 | Curtin et al. ................ 341/144 |
| 5,617,090 | A | * | 4/1997 | Ma et al. ..................... 341/141 |
| 5,706,005 | A | * | 1/1998 | Geraghty et al. ........... 341/144 |
| 6,292,123 | B1 | * | 9/2001 | Bowers et al. .............. 341/144 |
| 6,356,224 | B1 | | 3/2002 | Wohlfarth |

(Continued)

OTHER PUBLICATIONS

PCT International Search Report , Dec. 3, 2004.

*Primary Examiner*—Peguy JeanPierre
*Assistant Examiner*—Khai M. Nguyen
(74) *Attorney, Agent, or Firm*—Wolf, Greenfield & Sacks, P.C.

(57) ABSTRACT

A multi-channel integrated circuit comprises a plurality of channels (CH1 to CH20). A DAC (3) is provided in each channel (CH1 to CH20) for converting digital data inputted to the circuit (1) through an I/O port (14). Digital data to be converted by the DACs (3) is selectively applied to input registers (10) of each channel (CH1 to CH20) on a digital data bus (16) under the control of an interface and control logic circuit (15). The digital words written to the input registers (10) are in turn written to DAC registers (9) through corresponding digital switches (12) for conversion by the DACs (3). A clear code register (22) stores a clear code for writing to the DAC registers (9) in response to a clear signal applied to a clear terminal (24) of the circuit (1) so that analogue outputs appearing on output terminals (5) of the channels (CH1 to CH20) are of a predetermined value, typically, zero volts, when the circuit (1) is set in a clear condition. The clear code is written to the clear code register (22) through the I/O port (14) and the interface and control logic circuit (15).

46 Claims, 2 Drawing Sheets

U.S. PATENT DOCUMENTS

| | | | |
|---|---|---|---|
| 6,392,578 B1 * | 5/2002 | Russell | 341/144 |
| 6,466,149 B2 * | 10/2002 | Tabler | 341/144 |
| 6,570,517 B1 * | 5/2003 | Geraghty et al. | 341/141 |
| 6,823,416 B1 * | 11/2004 | Dempsey et al. | 710/305 |
| 2002/0105452 A1 | 8/2002 | Clapp et al. | |
| 2002/0121995 A1 | 9/2002 | Tabler | |

* cited by examiner

INTEGRATED CIRCUIT COMPRISING A DAC WITH PROVISION FOR SETTING THE DAC TO A CLEAR CONDITION, AND A METHOD FOR SETTING A DAC TO A CLEAR CONDITION

CROSS-REFERENCE TO RELATED APPLICATION

Priority under 35 U.S.C. §119(e) is hereby claimed to U.S. Provisional Application Ser. No. 60/431,908, filed Dec. 9, 2002, titled "DAC CIRCUIT, AND A METHOD FOR CLEARING A DAC".

FIELD OF THE INVENTION

The present invention relates to an integrated circuit comprising a digital-to-analogue converter (DAC) with provision for setting the DAC to a clear condition, and in particular, though not limited to a multi-channel circuit comprising one DAC in each channel with provision for setting the respective DACs to a clear condition. The invention also relates to a method for setting a DAC in an integrated circuit to a clear condition.

BACKGROUND OF THE INVENTION

Multi-channel integrated circuits comprising a DAC in each channel are known. Typically, such multi-channel integrated circuits receive digital data which is to be converted to analogue signals, and the respective analogue signals are outputted on analogue output terminals of the respective channels corresponding to the DACs. An interface and control logic circuit is provided in the integrated circuit for selectively transferring the digital data to respective ones of the DACs for conversion thereof to analogue output signals. In general, such circuits comprise a clear terminal to which a clear signal is applied for setting the DACs to a clear condition. The interface and control logic circuit reads the clear terminal, and on reception of a clear signal the interface and control logic circuit sets the DACs to the clear condition. This requires setting the digital words in DAC registers corresponding to the respective DACs to zero. Ideally, when the DACs are set to the clear condition, the analogue voltage appearing on the output terminals of the corresponding analogue channels should be a predetermined voltage, and in general, with the digital words in the respective DAC registers set to zero, the analogue output voltage appearing on the output terminals of the analogue channels should be zero volts. However, due to voltage offsets in the DACs, and in the analogue parts of the respective channels, the analogue output signals on the analogue output terminals, in many cases, is not zero or other such predetermined voltage when the DACs are set in the clear condition. This is undesirable.

There is therefore a need for an integrated circuit comprising a DAC with provision for setting the DAC to a clear condition which overcomes this problem. There is also a need for an integrated circuit with a plurality of channels having a DAC located in each channel with provision for setting the respective DACs to a clear condition which overcomes the problems of such known integrated circuits. Further, there is a need for a method for setting a DAC to a clear condition which overcomes the problems associated with setting known DACs to a clear condition.

The present invention is directed towards providing such an integrated circuit and a method, and the invention is also directed towards providing a multi-channel circuit comprising one DAC in each channel with provision for setting the DACs to a clear condition which overcomes the problems of such known circuits.

SUMMARY OF THE INVENTION

According to the invention there is provided an integrated circuit comprising:
 a digital-to-analogue converter (DAC),
 a clear code register for storing a digital clear code, and
 a control circuit responsive to a clear signal for transferring the clear code from the clear code register to the DAC, so that the DAC outputs an analogue output signal corresponding to the clear code in the clear condition.

In one embodiment of the invention the integrated circuit comprises a plurality of channels, a DAC being provided in each channel. Preferably, the control circuit is responsive to the clear signal for transferring the clear code from the clear code register to at least some of the DACs. Advantageously, the control circuit is responsive to the clear signal for transferring the clear code from the clear code register to each of the DACs.

In one embodiment of the invention a plurality of clear code registers are provided for storing clear codes for corresponding ones of at least some of the DACs, the control circuit being responsive to the clear signal for transferring the clear codes from the respective clear code registers to the corresponding DACs.

In another embodiment of the invention the number of DACs is greater than the number of clear code registers, and at least some of the clear code registers store the clear codes for respective pluralities of corresponding DACs.

In a further embodiment of the invention a clear code register is provided for each DAC for storing a clear code for the corresponding DAC.

Preferably, each clear code register is programmable, and advantageously, each clear code register is programmable independently of the other clear code registers.

In one embodiment of the invention a DAC register is provided corresponding to each DAC for sequentially storing digital words to be sequentially converted by the DAC, and the control circuit is responsive to the clear signal for transferring the clear code from the clear code register of the corresponding DAC to the corresponding DAC register.

In another embodiment of the invention an input terminal is provided for receiving the clear signal as an externally generated clear signal.

In one embodiment of the invention the clear code stored in each clear code register is of value for providing the analogue output signal outputted by the corresponding DAC on an analogue output terminal of the corresponding channel to be of a predetermined analogue value, and preferably, of a predetermined analogue voltage value.

In another embodiment of the invention the clear code stored in each clear code register is of value for providing the analogue output signal outputted by the corresponding DAC on an analogue output terminal of the corresponding channel to be of zero volts.

In a further embodiment of the invention the clear code stored in each clear code register is of value for providing the analogue output signal outputted by the corresponding DAC on an analogue output terminal of the corresponding channel with correction for voltage offset in the DAC.

In a still further embodiment of the invention the clear code stored in each clear code register is of value for providing the analogue output signal outputted by the corresponding DAC on an analogue output terminal of the corresponding channel with correction for voltage offset in the channel.

Additionally the invention provides a multi-channel integrated circuit comprising:
 a plurality of channels,
 a DAC located in each channel,
 a plurality of clear code registers for storing digital clear codes for respective ones of at least some of the DACs, and
 a control circuit responsive to a clear signal for transferring the clear codes from the clear code registers to the corresponding DACs, so that the corresponding DACs output an analogue output signal corresponding to the clear codes in the clear code condition.

Preferably, one clear code register is provided for each DAC.

The invention also provides a method for setting a DAC of an integrated circuit to a clear condition in response to a clear signal, the method comprising the steps of:
 providing a clear code register in the integrated circuit,
 storing a clear code in the clear code register, and
 transferring the clear code from the clear code register to the DAC in response to the clear signal so that the DAC outputs an analogue output signal corresponding to the clear code in the clear condition.

In one embodiment of the invention the clear code is written to the clear code register.

In another embodiment of the invention the integrated circuit comprises a plurality of channels with one DAC being located in each channel, and the method comprises the step of transferring the clear code from the clear code register in response to the clear signal to at least one of the DACs.

Preferably, the clear code is transferred to each of the DACs in response to the clear signal.

In another embodiment of the invention a plurality of clear code registers are provided, and clear codes for corresponding ones of at least some of the DACs are stored in the clear code registers.

In a further embodiment of the invention the number of clear code registers is less than the number of DACs, and at least some of the clear code registers store the clear codes for respective corresponding pluralities of the DACs.

Preferably, a clear code register is provided for each DAC, and advantageously, the clear codes are written to the respective clear code registers independently of each other.

Preferably, each clear code register is provided as a programmable register.

Preferably, the clear code for each clear code register is selected for providing the analogue output signal outputted by the corresponding DAC on an analogue output terminal of the corresponding channel to be of a predetermined analogue value, and advantageously, a predetermined analogue voltage value.

In one embodiment of the invention the clear code for each clear code register is selected for providing the analogue output signal outputted by the corresponding DAC on an analogue output terminal of the corresponding channel to be of zero volts.

In another embodiment of the invention the clear code for each clear code register is selected for providing the analogue output signal outputted by the corresponding DAC on an analogue output terminal of the corresponding channel with correction for voltage offset in the DAC.

In a further embodiment of the invention the clear code for each clear code register is selected for providing the output signal outputted by the corresponding DAC on an analogue output terminal of the corresponding channel with correction for voltage offset in the channel.

In a still further embodiment of the invention a DAC register is provided corresponding to each DAC for sequentially storing respective digital words to be sequentially converted by the DAC, and the clear code from the corresponding clear code register is written to the DAC register of the corresponding DAC in response to the clear signal.

In one embodiment of the invention the clear signal is an externally generated signal and is applied to the integrated circuit.

ADVANTAGES OF THE INVENTION

The advantages of the invention are many. The analogue output of the integrated circuit can be set to be of a predetermined value, for example, zero volts when the circuit is set in the clear condition. By providing the clear code register as a programmable register, the analogue output of the circuit may be set at any desired predetermined value when the circuit is set in the clear condition. The clear code can be selected to correct for offset errors in the DAC, in the channel in which the DAC is located, or for correcting for offset errors in both the DAC and the channel in which the DAC is located. Additionally, if a user application contains a systematic offset error, the clear code can be selected to correct for the systematic offset error when the DAC is set in the clear condition. Where the integrated circuit is a multi-channel circuit, and correction is to be made for offsets in the DACs and/or their corresponding channels, and where the offset errors are substantially similar, a single clear code register is sufficient to store one clear code for correcting for the offsets in each DAC and the corresponding channels when the DACs are set in the clear condition. However, where it is desired to provide specific correction for specific channels or specific groups of channels, then by providing the appropriate number of clear code registers, offset errors in the respective DACs and/or channels, or the respective groups of DACs and/or channels is facilitated when the DACs are set in the clear condition.

The invention and its many advantages will be apparent from the following description of some preferred embodiments thereof, which are given solely by way of example only, with reference to the accompanying drawings.

DETAILED DESCRIPTION OF PREFERRED EMBODIMENT OF THE INVENTION

Figure 1:
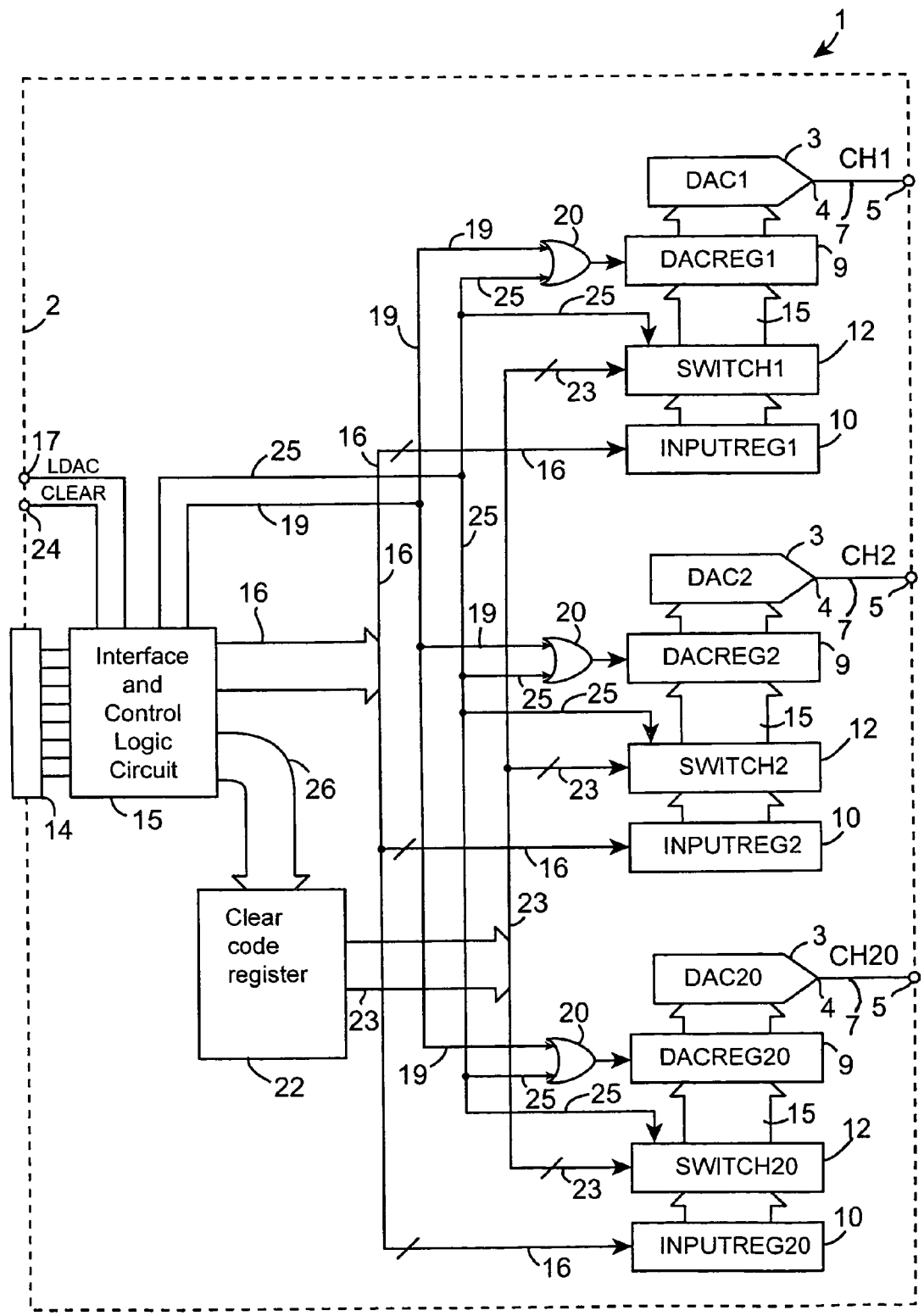
FIG. 1 is a block representation of an integrated circuit according to the invention.

Referring to the drawings and initially to FIG. 1, there is illustrated a multi-channel integrated circuit according to the invention, indicated generally by the reference numeral 1. The multi-channel circuit 1 is implemented as an integrated circuit on a single chip 2 and comprises a plurality of channels CH1 to CHN. In this embodiment of the invention the multi-channel circuit 1 comprises twenty channels CH1 to CH20. However, for convenience only channels CH1, CH2 and CH20 are illustrated.

A DAC 3 for converting digital data to an analogue output signal is located in each channel CH1 to CH20. The DACs 3 are identified as DACs DAC1 to DAC20, where the DAC DAC1 is located in the channel CH1, the DAC DAC2 is located in the channel CH2, and so on up to the DAC DAC20, which is located in the channel CH20. Analogue output signals from outputs 4 of the DACs 3 resulting from conversions of the digital data are applied to analogue output terminals 5 of the corresponding channels CH1 to CH20 through analogue parts 7 of the channels CH1 to CH20.

A DAC register 9 for sequentially storing digital words to be sequentially converted by the corresponding DAC 3 is located in each channel CH1 to CH20. The DAC registers 9 are identified as DACREG1 to DACREG20, the DAC register DACREG1 being located in channel CH1 and so on up to the DAC register DACREG20, which is located in channel CH20. An input register 10 in each channel CH1 to CH20 sequentially receives the respective digital words to be converted by the corresponding DAC 3. The digital words are written from the input register 10 to the corresponding DAC register 9 through a corresponding digital switch 12 as will be described below. The input registers 10 and digital switches 12 are identified as INPUTREG1 to INPUTREG20, and SWITCH1 to SWITCH20, respectively, the input register INPUTREG1 and the digital switch SWITCH1 being located in channel CH1, and so on up to the input register INPUTREG20 and the digital switch SWITCH20 which are located in channel CH20.

An I/O port 14 is provided to the multi-channel circuit 1 for inputting digital data to be converted by the DACs 3, as well as addresses and other relevant control signals. The I/O port 14 may be configured as a serial port or a parallel port. An interface and control logic circuit 15 receives the digital data, addresses and other control signals through the I/O port 14 and selectively writes digital words of the digital data to the input registers 10 in the appropriate channels CH1 to CH20 on a parallel digital data bus 16. The digital switches 12 are normally operated with the corresponding input register 10 switched through to the corresponding DAC register 9. A load DAC (LDAC) input terminal 17 which is read by the interface and control logic circuit 15 is provided for receiving appropriate externally generated load DAC signals for selectively opening the DAC registers 9 for receiving respective digital words from the corresponding input registers 10 for in turn loading the corresponding DACs 3 with the respective digital words to be converted. Corresponding load DAC signals are generated by the interface and control logic circuit 15 in response to the received load DAC signals, and are applied to the corresponding DAC registers 9 by the interface and control logic circuit 15 on a load DAC control bus 19 through corresponding OR gates 20 in response to the received load DAC signals on the LDAC input terminal 17, as will be described below.

In this embodiment of the invention a single clear code register 22 is provided in the multi-channel circuit 1 for storing a clear code for transfer to the DACs 3 when the DACs 3 are to be set in a clear condition. The clear code in the clear code register 22 is written to the DAC registers 9 under the control of the interface and control logic circuit 15 through the digital switches 12 on a parallel digital data bus 23. A clear terminal 24 is provided for receiving a clear signal for setting the DACs 3 into the clear condition, and the clear terminal 24 is read by the interface and control logic circuit 15. A control signal is outputted on a control line 25 by the interface and control logic circuit 15 to the digital switches 12 for operating the switches 12 for switching the DAC registers 9 through to the clear code register 22. The signal on the control line 25 is also applied through the OR gate 20 to the DAC registers 9 for opening the DAC registers 9 so that the clear code from the clear code register 22 can be written to the DAC registers 9, for in turn loading into the DACs 3.

The clear code register 22 is programmable through the I/O port 14 and the interface and control logic circuit 15, which writes the desired clear code to the clear code register 22 through a parallel digital data bus 26. Accordingly, any desired clear code may be written to the clear code register 22 so that when the multi-channel circuit 1 is set with the DACs 3 in the clear condition, the analogue output signals from the DACs 3 on the analogue output terminals 5 are of a predetermined value. Typically, the clear code which is written to the clear code register 22 is selected for compensating for voltage offset errors in the DACs 3 and/or the channels CH1 to CH20, and in particular, the analogue parts 7 of the channels CH1 to CH20 so that the voltage of the analogue output signals appearing on the analogue output terminals 5 is zero volts when the DACs 3 are set in the clear condition. This merely requires determining the voltage offset error on the analogue output terminals 5 when the digital words in the DAC registers 9 being converted by the DACs 3 comprises all zeros. The clear code is then selected so that the analogue output voltage which would be outputted by the DACs 3 on conversion of the selected clear code would be equal to the voltage offset error but of the opposite sign. Thus, when the clear code is written to the DAC registers 9, the analogue output signals resulting from the conversion of the clear code by the DACs 3 which appear on the analogue output terminals 5 is zero volts. However, it will be readily apparent to those skilled in the art that the clear code may be selected to provide any desired predetermined analogue output voltage on the analogue output terminals 5 of the respective channels CH1 to CH20.

In use, once the appropriate clear code has been determined, the clear code is written to the clear code register 22 through the I/O port 14 and the interface and control logic circuit 15. Digital data to be converted by the DACs 3 in the multi-channel circuit 1 is inputted through the I/O port 14 together with appropriate addresses, and appropriate load DAC signals are applied to the LDAC input terminal 17. The interface and control logic circuit 15 interprets the digital data and addresses, and selectively writes digital words of the digital data to the respective input registers 10 of the channels CH1 to CH20. The interface and control logic circuit 15 interprets the load DAC signals for opening the DAC registers 9, so that the digital words in the respective input registers 10 are transferred to the DAC registers 9, and in turn to the DACs 3 where they are converted. Analogue output signals corresponding to the converted digital words are outputted on the analogue output terminals 5 of the respective channels CH1 to CH20.

When it is desired to set the DACs 3 of the multi-channel circuit 1 in the clear condition, a clear signal is applied to the clear terminal 24. On reading the clear signal on the clear terminal 24, the interface and control logic circuit 15 outputs a control signal on the control line 25 for operating the digital switches 12 for switching the DAC registers 9 to the clear code register 22. The signal on the control line 25 is also applied to the DAC registers 9 through the OR gates 20 for in turn opening the DAC registers 9 so that the clear code from the clear code register 22 is written to the DAC registers 9. The DACs 3 thus convert the clear code in the DAC registers 9, and each DAC 3 outputs an analogue output signal corresponding to the clear code which appears on the corresponding analogue output terminal 5. If the clear code has been selected to correct for voltage offsets in the DACs 3 and the channels CH1 to CH20, then the analogue output signals appearing on the analogue output terminals 5 should be zero volts. Otherwise, the analogue output signals appearing on the analogue output terminals 5 when the DACs 3 are set in the clear condition will be a predetermined voltage corresponding to the clear code, and allowing for voltage offset errors in the DACs 3 and the channels CH1 to CH20.

In normal operation the clear terminal 24 is pulled high, and when it is desired to set the DACs 3 of the multi-channel circuit 1 in the clear condition, the signal on the clear terminal 24 is pulled low. For so long as the clear terminal 24 remains in the low state, the multi-channel circuit 1 is operated with the DACs 3 in the clear condition. To terminate the clear condition, the signal on the clear terminal 24 is again pulled high.

Additionally, in this embodiment of the invention the interface and control logic circuit 15 is programmed so that in a default condition, and initially on power-up the DAC registers 9 are loaded with all zeros.

Figure 2:
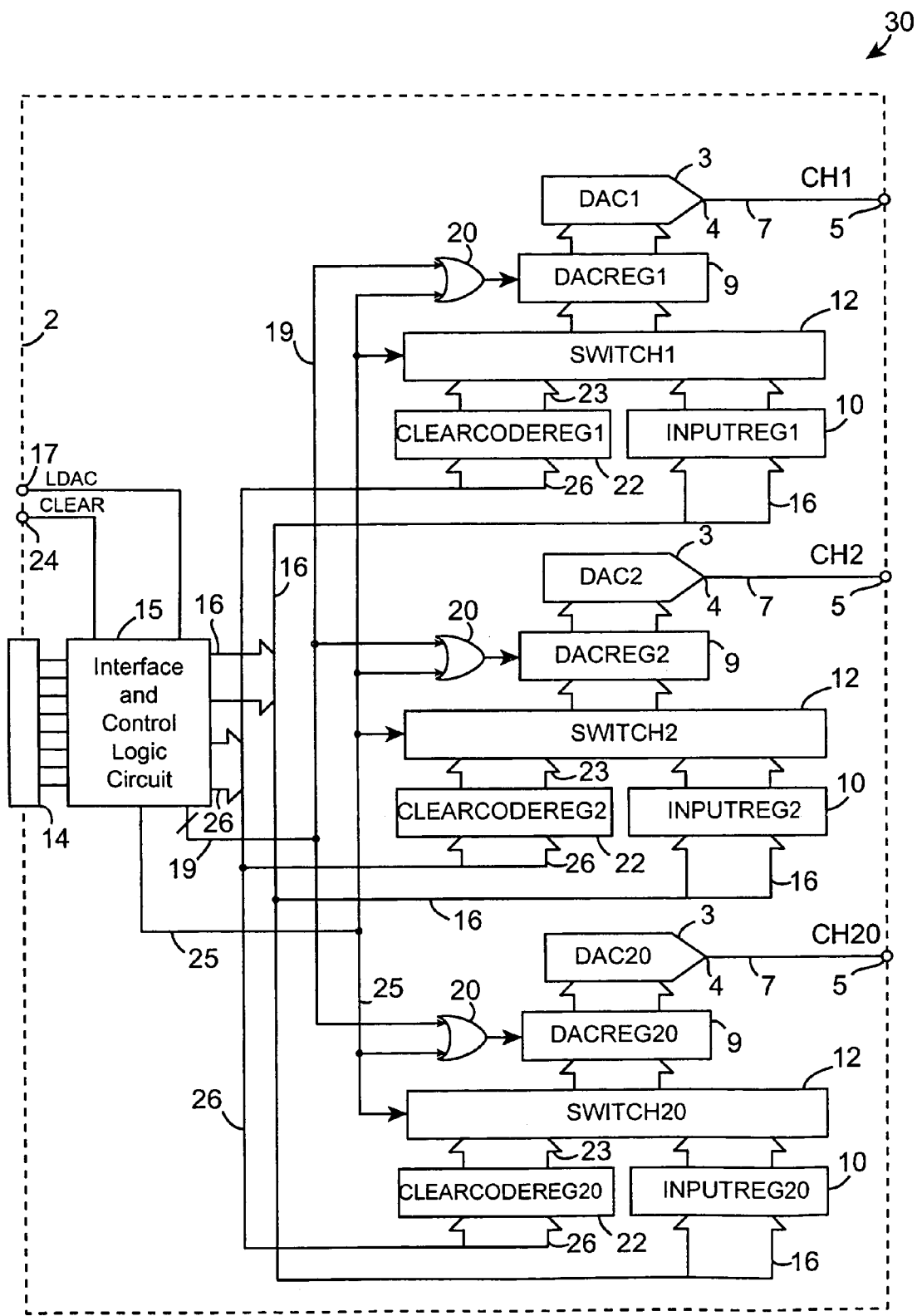
FIG. 2 is a block representation of an integrated circuit according to another embodiment of the invention.

Referring now to FIG. 2, there is illustrated a multi-channel circuit according to another embodiment of the invention, indicated generally by the reference numeral 30. The multi-channel circuit 30 is substantially similar to the multi-channel circuit 1, and similar components are identified by the same reference numerals. The main difference between the multi-channel circuit 30 and the multi-channel circuit 1 is that a clear code register 22 is provided for each channel CH1 to CH20. Each of the clear code registers 22 are programmable for storing an appropriate clear code for the corresponding DAC 3. The clear code registers are identified as CLEARCODEREG1 to CLEARCODEREG20, the CLEARCODEREG1 corresponding to channel CH1, while the clear code register CLEARCODEREG20 corresponds to channel CH20. Each clear code register 22 is individually programmable and addressable by the interface and control logic circuit 15 through the parallel digital data bus 26. The desired clear codes for the respective clear code registers 22 along with their corresponding addresses are inputted through the I/O port 14 to the interface and control logic circuit 15. The clear codes are written from the clear code registers 22 on respective data buses 23 through the corresponding switches 12 to the corresponding DAC registers 9 as already described with reference to the multi-channel circuit 1 described with reference to FIG. 1.

On the interface and control logic circuit 15 outputting a control signal on the control line 25 in response to a clear signal being read on the clear terminal 24 the digital switches 12 are operated for switching the clear code registers 22 to the corresponding DAC registers 9, and the control signal on the control line 25 is also applied to the DAC registers 9 through the OR gate 20 for opening the DAC registers 9 so that the clear code from the corresponding clear code register 22 is written thereto. The clear code in the DAC registers 9 are then converted by the DACs 3 to analogue output signals which appear on the corresponding analogue output terminals 5.

The advantage of providing separate clear code registers 22 corresponding to the respective channels CH1 to CH20 facilitates correction for voltage offset errors in the corresponding respective DACs 3 and channels CH1 to CH20 independently of each other. This is a particular advantage should the voltage offsets in the respective DACs 3 and channels CH1 to CH20 differ from one to the other. Additionally, it may be desired to provide analogue output signals on the respective analogue output terminals 5 of different voltages when the DACs 3 of the multi-channel circuit 1 are set in the clear condition, and if so, appropriate clear codes can thus be written to the respective clear code registers 22.

Otherwise, the multi-channel circuit 30 and its operation is similar to that of the multi-channel circuit 1.

Another advantage of the invention is that the clear code may be used for the purpose of calibration of each DAC and/or each channel, and where the circuit forms part of a user application, for calibrating the user application circuit as well. Calibration of the DAC, and/or analogue channel, and/or user application would be carried out by sequentially entering a clear code or clear codes corresponding to a load full scale voltage or zero scale voltage into the clear code register or registers. By applying the clear signal to the integrated circuit the appropriate clear code or clear codes for providing the load full scale voltage or zero scale voltage as the case may be would be transferred to the DAC registers, thereby removing the need to write individual full scale or zero scale voltage codes to all the DACs separately.

While the multi-channel circuit 1 has been described as comprising a single clear code register, and the multi-channel circuit 30 has been described as comprising a plurality of clear code registers, one clear code register being provided for each channel, it is envisaged in certain cases that while more than one clear code register will be provided, a clear code register may not be provided for each channel. In which case, it is envisaged that each clear code register may store a clear code for a number of corresponding channels. Indeed, it is envisaged in certain cases that some clear code registers may be provided for storing a clear code for one single corresponding channel, while others may be provided for storing a clear code for a number of corresponding channels.

While the clear code registers have been described as being programmable, in certain cases, it is envisaged that the clear code registers may not be programmable. Indeed, in certain cases, it is envisaged that where the clear code registers are programmable, they may not be programmable independently of each other.

It will be appreciated that while the integrated circuits have been described as being multi-channel circuits, in certain cases, it is envisaged that an integrated circuit may be provided with a single channel with a single DAC in the channel. In which case, a single clear code register would be provided for storing a clear code for loading to the DAC when the circuit is to be set in a clear condition. Additionally, it will be appreciated that the multi-channel circuit may be provided with any number of channels greater than or less than twenty.

While the clear signal has been described as being a signal applied to a clear terminal of the multi-channel circuits, in certain cases, it is envisaged that the clear signal may be provided as a software clear signal. In which case it is envisaged that the clear signal would be entered as a digital code through the I/O port 14 to the interface and control logic circuit 15. Additionally, where a clear terminal is provided for receiving a clear signal, any suitable clear signal besides that described may be used. Indeed, instead of the clear signal being provided by pulling a high signal applied to the clear terminal low, the clear signal could be provided by pulling a low signal on the clear terminal high. Alternatively, the clear signal may be provided as a low going or a high going pulse which would be applied to the clear terminal. Additionally, the clear signal may be read by any suitable circuitry, whether in the interface and control logic circuit or otherwise, and such circuitry may, for example, be provided by a state machine for reading the state of the clear terminal.

What is claimed is:

1. An integrated circuit comprising:
    a digital-to-analogue converter (DAC),
    a clear code register for storing a digital clear code, and
    a control circuit responsive to a clear signal for transferring the clear code from the clear code register to the DAC, so that the DAC outputs an analogue output signal corresponding to the clear code in the clear condition.

2. An integrated circuit as claimed in claim 1 in which the integrated circuit comprises a plurality of channels, a DAC being provided in each channel.

3. An integrated circuit as claimed in claim 2 in which the control circuit is responsive to the clear signal for transferring the clear code from the clear code register to at least some of the DACs.

4. An integrated circuit as claimed in claim 2 in which the control circuit is responsive to the clear signal for transferring the clear code from the clear code register to each of the DACs.

5. An integrated circuit as claimed in claim 2 in which a plurality of clear code registers are provided for storing clear codes for corresponding ones of at least some of the DACs, the control circuit being responsive to the clear signal for transferring the clear codes from the respective clear code registers to the corresponding DACs.

6. An integrated circuit as claimed in claim 5 in which the number of DACs is greater than the number of clear code registers, and at least some of the clear code registers store the clear codes for respective pluralities of corresponding DACs.

7. An integrated circuit as claimed in claim 5 in which a clear code register is provided for each DAC for storing a clear code for the corresponding DAC.

8. An integrated circuit as claimed in claim 5 in which each clear code register is programmable.

9. An integrated circuit as claimed in claim 8 in which each clear code register is programmable independently of the other clear code registers.

10. An integrated circuit as claimed in claim 5 in which the clear code stored in each clear code register is of value for providing the analogue output signal outputted by the corresponding DAC on an analogue output terminal of the corresponding channel to be of a predetermined analogue value.

11. An integrated circuit as claimed in claim 5 in which the clear code stored in each clear code register is of value for providing the analogue output signal outputted by the corresponding DAC on an analogue output terminal of the corresponding channel to be of a predetermined analogue voltage value.

12. An integrated circuit as claimed in claim 5 in which the clear code stored in each clear code register is of value for providing the analogue output signal outputted by the corresponding DAC on an analogue output terminal of the corresponding channel to be of zero volts.

13. An integrated circuit as claimed in claim 5 in which the clear code stored in each clear code register is of value for providing the analogue output signal outputted by the corresponding DAC on an analogue output terminal of the corresponding channel with correction for voltage offset in the DAC.

14. An integrated circuit as claimed in claim 5 in which the clear code stored in each clear code register is of value for providing the analogue output signal outputted by the corresponding DAC on an analogue output terminal of the corresponding channel with correction for voltage offset in the channel.

15. An integrated circuit as claimed in claim 2 in which a DAC register is provided corresponding to each DAC for sequentially storing digital words to be sequentially converted by the DAC, and the control circuit is responsive to the clear signal for transferring the clear code from the clear code register of the corresponding DAC to the corresponding DAC register.

16. An integrated circuit as claimed in claim 1 in which an input terminal is provided for receiving the clear signal as an externally generated clear signal.

17. An integrated circuit as claimed in claim 1 in which the clear code register is programmable.

18. An integrated circuit as claimed in claim 1 in which the clear code stored in the clear code register is of value for providing the analogue output signal outputted by the DAC to be of a predetermined analogue value.

19. An integrated circuit as claimed in claim 1 in which the clear code stored in the clear code register is of value for providing the analogue output signal outputted by the DAC to be of a predetermined analogue voltage value.

20. An integrated circuit as claimed in claim 1 in which the clear code stored in the clear code register is of value for providing the analogue output signal outputted by the DAC to be of zero volts.

21. An integrated circuit as claimed in claim 1 in which the clear code stored in the clear code register is of value for providing the analogue output signal outputted by the DAC with correction for voltage offset in the DAC.

22. An integrated circuit as claimed in claim 1 in which the clear code stored in the clear code register is of value for providing the analogue output signal outputted by the DAC with correction for voltage offset in a channel in which the DAC is provided.

23. An integrated circuit as claimed in claim 1 in which a DAC register is provided for sequentially storing digital words to be sequentially converted by the DAC, and the control circuit is responsive to the clear signal for transferring the clear code from the clear code register to the DAC register.

24. A multi-channel integrated circuit comprising:
    a plurality of channels,
    a DAC located in each channel,
    a plurality of clear code registers for storing digital clear codes for respective ones of at least some of the DACs, and
    a control circuit responsive to a clear signal for transferring the clear codes from the clear code registers to the corresponding DACs, so that the corresponding DACs output an analogue output signal corresponding to the clear codes in the clear code condition.

25. A multi-channel integrated circuit as claimed in claim 24 in which one clear code register is provided for each DAC.

26. A method for setting a DAC of an integrated circuit to a clear condition in response to a clear signal, the method comprising the steps of:
    providing a clear code register in the integrated circuit,
    storing a clear code in the clear code register, and
    transferring the clear code from the clear code register to the DAC in response to the clear signal so that the DAC outputs an analogue output signal corresponding to the clear code in the clear condition.

27. A method as claimed in claim 26 in which the clear code is written to the clear code register.

28. A method as claimed in claim 26 in which the integrated circuit comprises a plurality of channels with one DAC being located in each channel, and the method comprises the step of transferring the clear code from the clear code register in response to the clear signal to at least one of the DACs.

29. A method as claimed in claim 28 in which the clear code is transferred to each of the DACs in response to the clear signal.

30. A method as claimed in claim 28 in which a plurality of clear code registers are provided, and clear codes for corresponding ones of at least some of the DACs are stored in the clear code registers.

31. A method as claimed in claim 30 in which the number of clear code registers is less than the number of DACs, and at least some of the clear code registers store the clear codes for respective corresponding pluralities of the DACs.

32. A method as claimed in claim 30 in which a clear code register is provided for each DAC.

33. A method as claimed in claim 30 in which the clear codes are written to the respective clear code registers independently of each other.

34. A method as claimed in claim 30 in which the clear code for each clear code register is selected for providing the analogue output signal outputted by the corresponding DAC on an analogue output terminal of the corresponding channel to be of a predetermined analogue value.

35. A method as claimed in claim 30 in which the clear code for each clear code register is selected for providing the analogue output signal outputted by the corresponding DAC on an analogue output terminal of the corresponding channel to be of a predetermined analogue voltage value.

36. A method as claimed in claim 30 in which the clear code for each clear code register is selected for providing the analogue output signal outputted by the corresponding DAC on an analogue output terminal of the corresponding channel to be of zero volts.

37. A method as claimed in claim 30 in which the clear code for each clear code register is selected for providing the analogue output signal outputted by the corresponding DAC on an analogue output terminal of the corresponding channel with correction for voltage offset in the DAC.

38. A method as claimed in claim 30 in which the clear code for each clear code register is selected for providing the output signal outputted by the corresponding DAC on an analogue output terminal of the corresponding channel with correction for voltage offset in the channel.

39. A method as claimed in claim 28 in which a DAC register is provided corresponding to each DAC for sequentially storing respective digital words to be sequentially converted by the DAC, and the clear code from the corresponding clear code register is written to the DAC register of the corresponding DAC in response to the clear signal.

40. A method as claimed in claim 26 in which each clear code register is provided as a programmable register.

41. A method as claimed in claim 26 in which the clear signal is an externally generated signal and is applied to the integrated circuit.

42. A method as claimed in claim 26 in which the clear code for the clear code register is selected for providing the analogue output signal outputted by the DAC to be of a predetermined analogue value.

43. A method as claimed in claim 26 in which the clear code for the clear code register is selected for providing the analogue output signal outputted by the DAC to be of zero volts.

44. A method as claimed in claim 26 in which the clear code for the clear code register is selected for providing the analogue output signal outputted by the DAC with correction for voltage offset in the DAC.

45. A method as claimed in claim 26 in which the clear code for the clear code register is selected for providing the output signal outputted by the DAC with correction for voltage offset in a channel in which the DAC is provided.

46. A method as claimed in claim 26 in which a DAC register is provided for sequentially storing digital words to be sequentially converted by the DAC, and the clear code from the clear code register is written to the DAC register in response to the clear signal.

* * * * *